United States Patent [19]
Chang et al.

[11] Patent Number: 6,094,102
[45] Date of Patent: Jul. 25, 2000

[54] FREQUENCY SYNTHESIZER USING MICRO ELECTRO MECHANICAL SYSTEMS (MEMS) TECHNOLOGY AND METHOD

[75] Inventors: Mau Chung F. Chang, Thousand Oaks; Henry O. Marcy, 5th, Camarillo; Kenneth D. Pedrotti, Thousand Oaks, all of Calif.; David R. Pehlke, Chapel Hill, N.C.; Charles W. Seabury, Calabasas; Jun J. Yao, Thousand Oaks, both of Calif.; James L. Bartlett, Cedar Rapids, Iowa; J. L. Julian Tham, San Jose; Deepak Mehrotra, Thousand Oaks, both of Calif.

[73] Assignee: Rockwell Science Center, LLC, Thousand Oaks, Calif.

[21] Appl. No.: 09/302,535

[22] Filed: Apr. 30, 1999

[51] Int. Cl.[7] .............................. H03L 7/107; H03D 3/00
[52] U.S. Cl. ............................... 331/17; 331/23; 327/56; 327/57; 455/208; 455/260; 360/30; 360/51; 329/325
[58] Field of Search ................................. 331/17, 18, 23, 331/25, DIG. 2; 329/325; 327/156–159; 360/30, 51; 455/260, 208

[56] References Cited

U.S. PATENT DOCUMENTS 5,880,921  3/1999  Tham et al. .......................... 361/233
5,959,516  9/1999  Chang et al. .......................... 334/14

OTHER PUBLICATIONS

Cheng T. Wang, editor, "Inroduction to Semiconductor Technology: GaAs and Related Compounds", *John Wiley & Sons, Inc.*, pp. 187–195 and 422–423, (1990).

Darrin J. Young et al, *Solid–State Sensor and Actuator Workshop, Hilton Head, South Carolina*, "A Micromachined Variable Capacitor for Monolithic Low–Noise VCOS", pp. 86–89, (Jun. 2–6, 1996).

*Primary Examiner*—David Mis
*Attorney, Agent, or Firm*—Koppel & Jacobs

[57] ABSTRACT

A frequency stabilizer circuit in the form of a charge-pump phase-lock loop utilizing a MEMS capacitance device, preferably a tunable MEMS capacitor or a MEMS capacitor bank, which more rapid and with a greater precision determine the phase and frequency of a carrier signal so that it can be extracted, providing an information signal of interest. Such MEMS devices have the added advantage of providing linear capacitance, low insertion losses, higher isolation and high reliability, they run on low power and permit the entire circuit to be fabricated on a common substrate. The use of the MEMS capacitance device reduces unwanted harmonics generated by the circuit's charge pump allowing the filtering requirements to be relaxed or perhaps eliminated.

38 Claims, 5 Drawing Sheets

CHARGE-PUMP PHASE LOCK LOOP CIRCUIT ic # FREQUENCY SYNTHESIZER USING MICRO ELECTRO MECHANICAL SYSTEMS (MEMS) TECHNOLOGY AND METHOD

BACKGROUND OF THE INVENTION

1. Field of the Invention

This invention relates to phase-lock loop systems and more particularly to phase-lock loop systems for frequency stabilizers.

2. Description of the Related Art

Phase-lock loops (PLLs) find applications in a wide variety of devices including wireless communication systems, disk drive electronics, high speed digital circuits and instrumentation. A PLL is simply a servo system that controls the phase of an output signal so that the phase error between the output signal and a reference input signal are reduced to a minimum. PLL circuits include at a minimum a phase/frequency detector (PFD) and a voltage control oscillator (VCO). It is also common for these circuits to contain a charge pump which is used to convert the logic states of the PFD into analog signals suitable for controlling the VCO. Such circuits are known as charge-pump phase-lock loops.

Charge-pump PPL's are commonly used to lock a local oscillating signal to a carrier frequency so that the carrier frequency can be removed, leaving an information signal of interest. Many of the devices which utilize charge-pump phase-lock loop systems operate in the microwave (900 MHZ–30 GHz) or millimeter wave (30–300 GHz) portion of the electromagnetic spectrum.

As shown in FIG. 1, a prior art charge-pump PPL circuit 20 includes a VCO 22, which may be implemented as an LC tank circuit and which develops a local oscillating signal that is locked to a remotely received carrier signal. Both the local signal (whose frequency may be divided by a factor N) and the remote signal are applied to a PFD 24 which compares their phases and frequencies. The phase/frequency difference between the two signals results in a voltage output which is received by a charge pump 26. The charge pump, otherwise known as a transresistance amplifier, converts the voltage signal into a current signal which is provided to a fixed capacitor 28. The capacitor integrates the current, producing an output voltage which is supplied to the VCO to adjust the local signal. A low pass filter 30 is often utilized to remove unwanted harmonics generated by charge pump 26. The filter is commonly placed in the circuit prior to the VCO. The circuit may additionally contain a divider 32 between the VCO and the PFD to reduce the frequency of the local signal generated by the VCO.

As the capacitance of capacitor 28 is fixed, the designer must make an initial decision as to its size. If a large capacitor is selected, integration is slow but the system finds the carrier signal much faster then it would with a small capacitor. This is primarily due to limited over- and under-shoot. However, the larger capacitor may lack sensitivity to accurately lock onto the carrier signal. A smaller capacitor, on the other hand, results in a more accurate lock onto the carrier signal but the process is much slower. This is primarily due to the large number of over- and under-shoots. However, a small capacitor permits a more accurate lock onto the carrier signal. Alternately, a conventional variable capacitor can be utilized. However, conventional variable capacitors only slightly improve the situation in that their tunability is only on the order of 2:1. These capacitors are also quite large in size and their tuning quite slow. Other smaller variable capacitors have been used, but they too had limited tunability range. See Darrin J. Young and Bernhard E. Boser, "A Micromachined Variable Capacitor for Monolithic Low-Noise VCOS," Technical Digest of the 1996 Solid-State Sensor and Actuator Workshop, Hilton Head, S.C., pp. 86–89.

SUMMARY OF THE INVENTION

In view of the above problems, the present invention provides a charge-pump phase-lock loop circuit that more rapidly and with greater precision determines the phase and frequency of a carrier signal so that it can be extracted, to obtain an information signal of interest. This is achieved by the use of a Micro Electro-Mechanical Systems (MEMS) adjustable capacitance device. The MEMS capacitance device could be a single tunable MEMS capacitor, a series of tunable MEMS capacitors, or a MEMS switched capacitor bank. Such MEMS devices have the added advantage of providing low insertion losses, higher isolation, high reliability, and linear capacitance. They run on low power and permit the entire circuit to be fabricated on a common substrate. Using the large tunability range of the MEMS device, an initial large capacitance is preferably set. The capacitance is reduced to rapidly converge the local signal to the carrier signal. This permits rapid and accurate lock of the local signal to the carrier signal. The use of MEMS tunable capacitance devices prevents large over- and under-shoots of the local signal in locking onto the carrier signal, thereby reducing unwanted harmonics generated by the charge pump and allowing the filtering requirements of the low pass filter to be relaxed and perhaps eliminated.

Further features and advantages of the invention will be apparent to those skilled in the art from the following detailed description, taken together with the accompanying drawings.

DETAILED DESCRIPTION OF THE INVENTION

The invention uses a MEMS capacitance device, preferably a tunable MEMS capacitor or a MEMS capacitor bank, to implement a frequency synthesizer which not only has a better capacitance range then that provided by conventional fixed or adjustable capacitors, but can be monolithically integrated. The MEMS capacitor provides linear capacitance with low insertion losses, higher isolation, higher reliability, and requires less power since the device is operated by electrostatic force.

Figure 1:
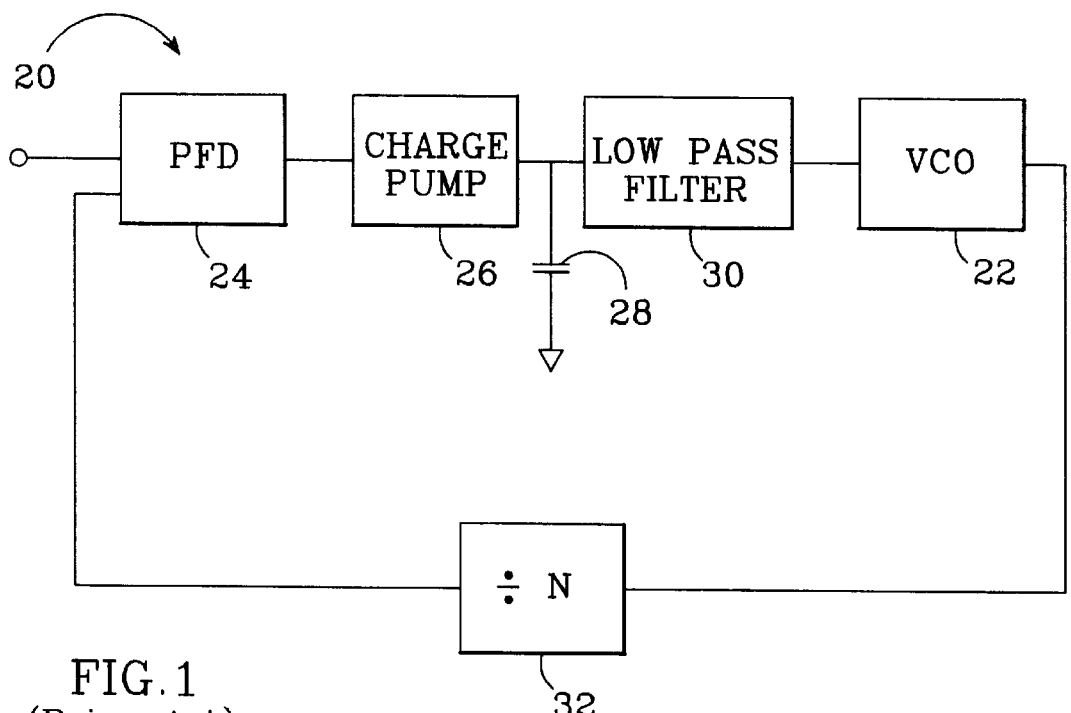
FIG. 1 is a block diagram of a prior art charge-pump PPL circuit using a conventional fixed or variable capacitor.
Figure 2:
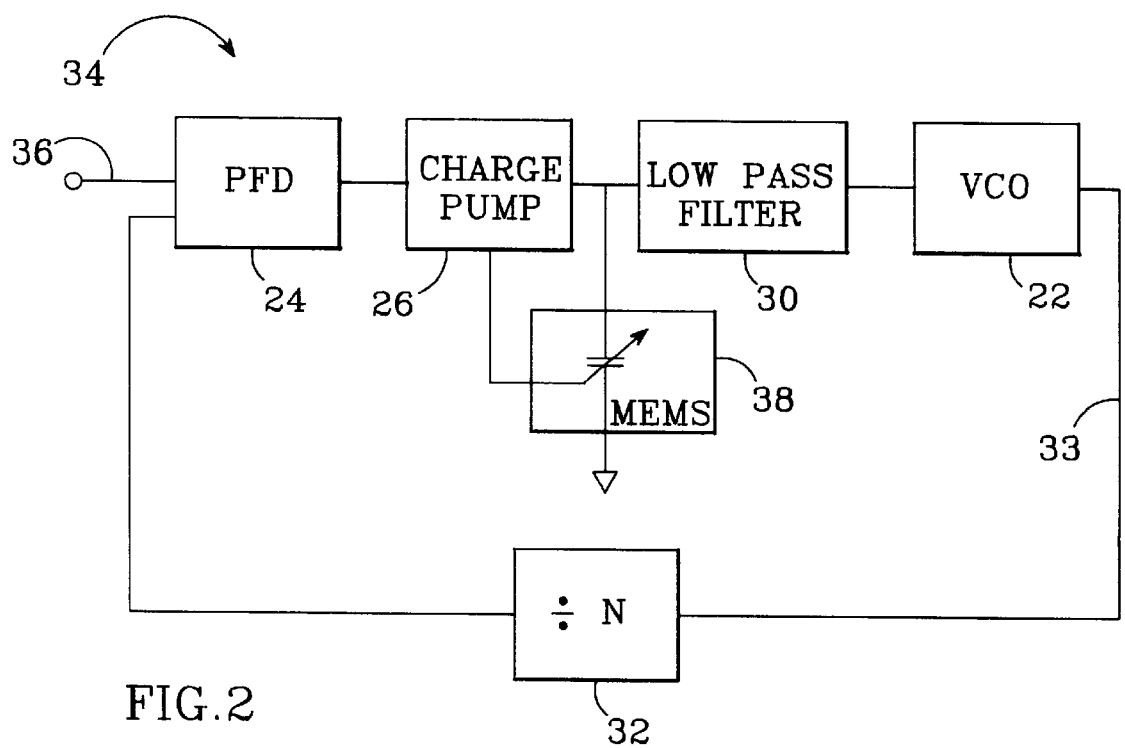
FIG. 2 is a block diagram of a new circuit in accordance with the invention utilizing a MEMS variable capacitance device.

FIG. 2 shows a block diagram of one implementation of the circuit. The objective is to match a locally generated signal to the carrier portion of a remotely generated signal at an input terminal 36 to remove the carrier signal and obtain its modulated information signal. The preferred embodiment shown in FIG. 2 is similar to the charge-pump PPL circuit 20 of FIG. 1, but a MEMS variable capacitor 38 is used. The frequency of the MEMS capacitor is preset to establish an initial input to the phase detector 24 with a frequency equal to the carrier signal to be received at input terminal 36. The MEMS tunable capacitor 38 integrates the current output from the charge pump 26 to determine how far off in frequency and in phase the VCO generated signal is from the carrier signal. The capacitance of capacitor 38 can be controlled either remotely or preferably by an output from charge pump 26. This can be handled in one of several fashions, with either the charge pump suppling a voltage signal to the master side of the MEMS capacitor, as described below, or by the use of a look up table that would provide a feedback signal to MEMS capacitor based on an initial signal received from charge pump 26. The MEMS capacitor is tunable over a range of approximately 10 to 1, or more. This allows for a large capacitance to be initially set, followed by a rapid reduction in capacitance to accurately match and remove the carrier signal. This approach not only provides for a rapid determination of the carrier signal, but also permits the signal to be accurately defined. In conventional circuits, the capacitance is normally fixed at a relatively large value in order to help assure that the locally generated signal approximates the carrier signal. This results in charge pump 26 producing a relatively large $\Delta I$ with an accompanying high level of detrimental harmonics, requiring the presence of a low pass filter 30 to remove them. The use of a MEMS capacitor 38 provides the unexpected advantage of allowing low pass filter 30 to be removed or at least be a less sophisticated, lower cost filter than is conventionally used. This is due to the fact that, for most of the circuit's operation, capacitor 38 has a small capacitance as the carrier signal is being honed in on. This results in a small $\Delta V$ being produced by phase detector 24, and likewise a small $\Delta I$ being produced by charge pump 26. As the current produced by charge pump 26 is quite small the unwanted harmonics generated by pump 26 also lessen. The filter 30 can therefore either be a less sophisticated filter, or preferably removed.

Figure 3:
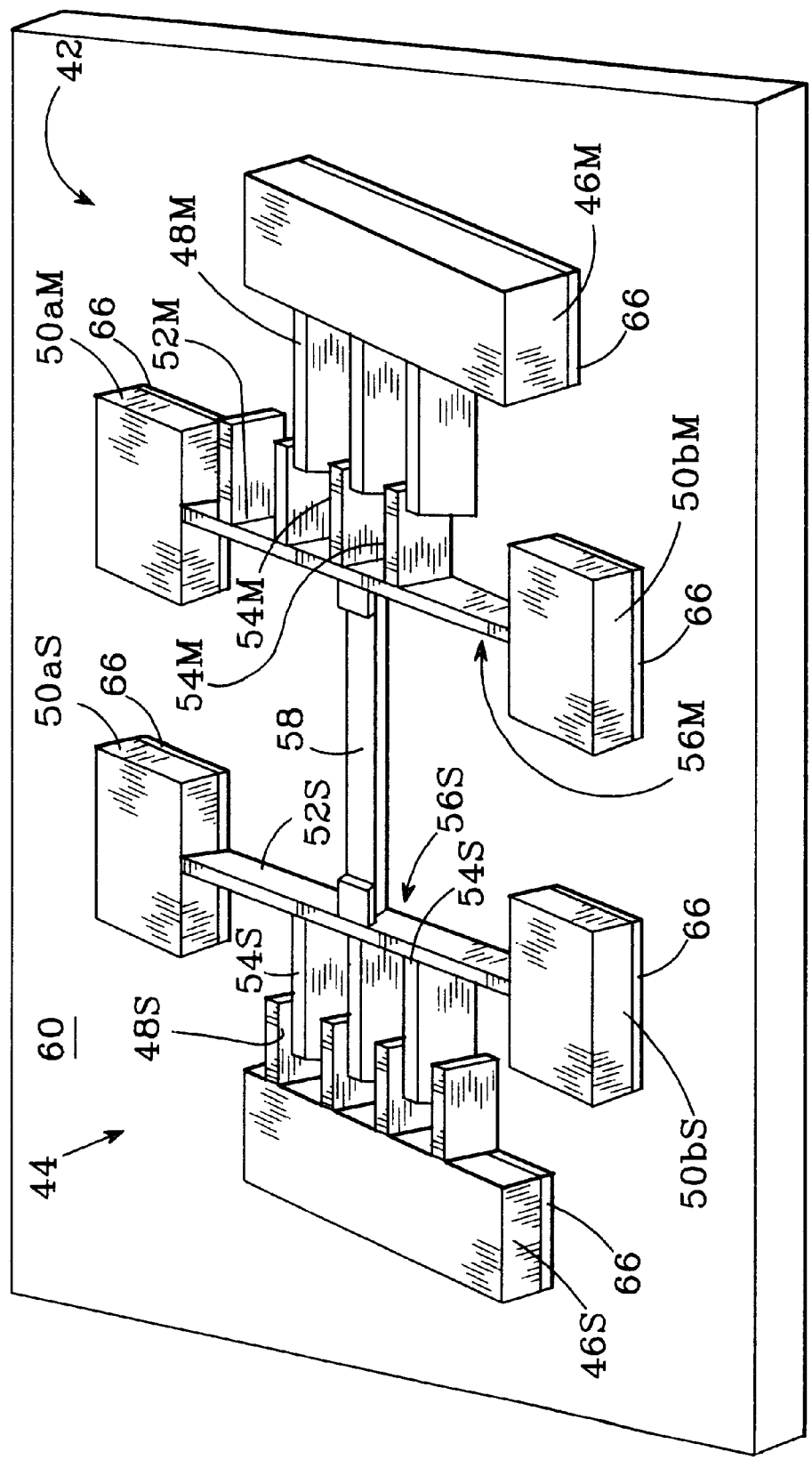
FIG. 3 is perspective view of a master-slave configuration for a tunable MEMS capacitor used in one embodiment.

FIG. 3 is a perspective view of the MEMS tunable capacitor 38 shown in FIG. 2. The capacitor 38 comprises a master-slave capacitor structure fabricated on a common substrate 40, preferably silicon. A master (control) capacitor 42 responds to a control voltage to set the capacitance of the slave (signal) capacitor 44. The capacitors 42 and 44 have respective contact 46M and 46S mounted to substrate 60, with respective sets of flat parallel fingers 48M and 48S extending from contact 46M and 46S parallel to and elevated above the substrate surface, with the flat fingers surfaces vertical. Capacitors 42 and 44 include respective second pairs of contacts 50aM, 50bM, and 50aS, 50bS with bridge structures 52M and 52S respectively connecting the two contact pairs. Bridges 52M and 52S carry respective second sets of flat fingers 54M and 54S which are substantially parallel and interdigitated with fingers 48m and 48S. Bridges 52M and 52S and their associated fingers 54M and 54S form a series of movable capacitor plates 56M and 56S and are connected to each other by a mechanical coupler 58.

In the master-slave configuration, a signal voltage $V_{sig}$ (typically an RF signal in the MHZ to Ghz frequency range) is applied via contacts 46S and 50aS, 50bS across fingers 48s and 54s. A low frequency control voltage $V_c$ is applied across fingers 48M and 54M to produce an electrostatic force that attracts its movable capacitor plate 56M toward contact 46M causing a change in the capacitance of capacitor 44. The interdigitated configuration is preferred because it can be designed so that the force is independent of the displacement in the x direction. This is achieved by spacing the fingers evenly so that the force between them cancel and the fringing forces at the ends of the fingers in the z-direction dominate.

The master and slave capacitors 42 and 44 respectively, are oriented so that the electrostatic force produced by the signal voltage is orthogonal to the motion of movable plate 56M of master capacitor 42 in the Z direction. In order to make the direction of force on the slave capacitor 44 perpendicular to the direction of motion so that the spring constant can be low in the direction of motion and high in the direction of force, the interdigitated fingers 48M, 48S and 54M, 54S are offset so that they are a symmetric. The force between the fingers dominates the much smaller fringing force such that the lateral spring constant can be relatively small thereby providing a large range of motion and a correspondingly large tuning ratio, presumably on the order of 10:1 or more.

The invention can be implemented with a variety of substrate materials requiring several active device types. A monolithic microwave integrated circuit (MMIC is an I.C. in which microwave frequency active devices are integrated with passive components to perform a specific circuit function). A key advantage presented by the invention is the ability to integrate a series of microwave frequency active devices and their associated passive components (referred to herein as "MMIC components"), with a MEMS tunable capacitor on a common substrate, using MMIC fabrication processes. MMIC fabrication techniques are well known, and are discussed, for example, in C. T. Wang, *Introduction to Semiconductor Technology*, John Willy and Sons (1990), pp. 187–195 (active devices) and pp. 422–433 (passive components).

Figure 4A:
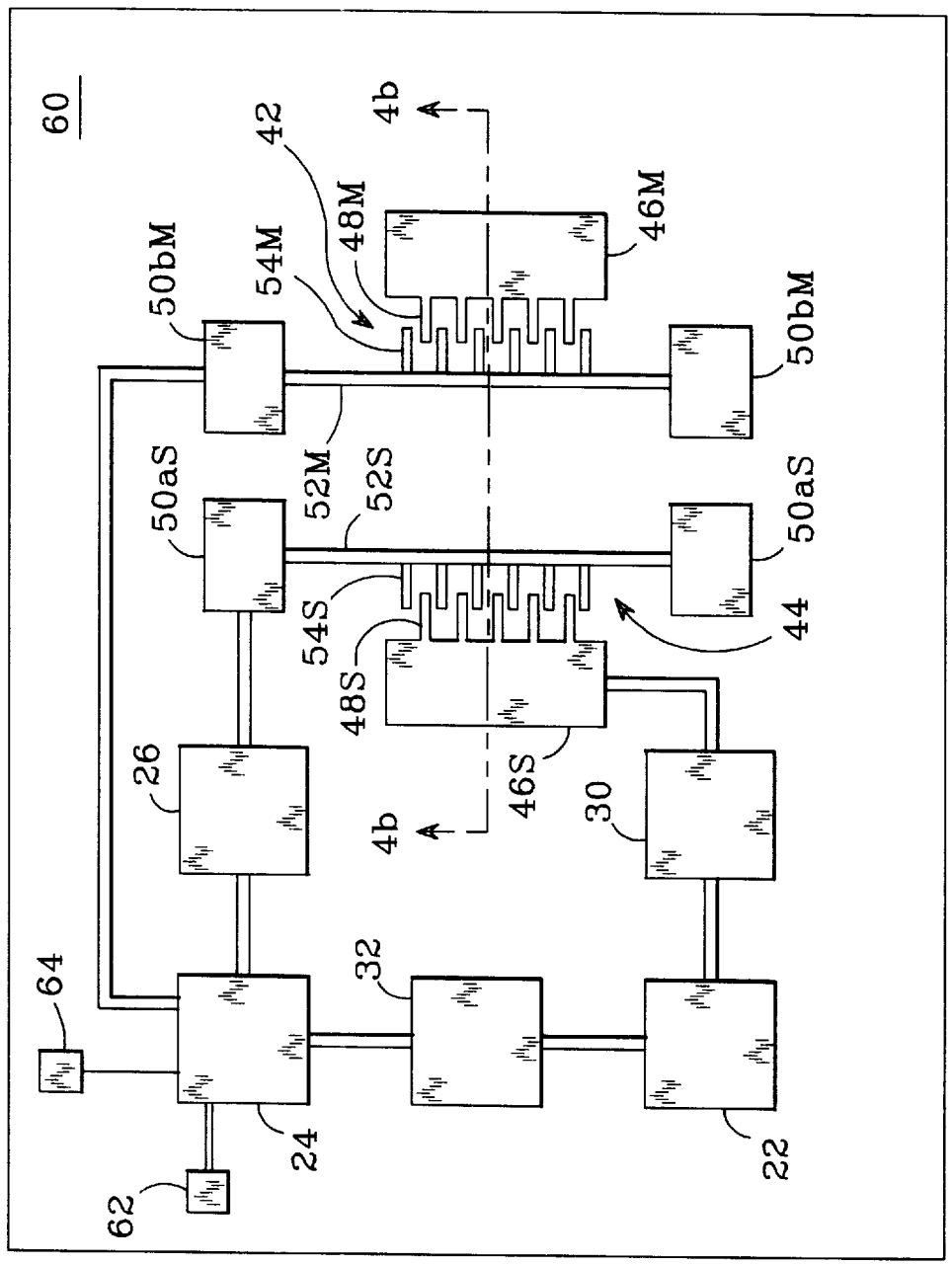
FIGS. 4a and 5a are plan views showing sequential steps in the integration of a MEMS tunable capacitor into a charge-pump PPL circuit.
Figure 5A:
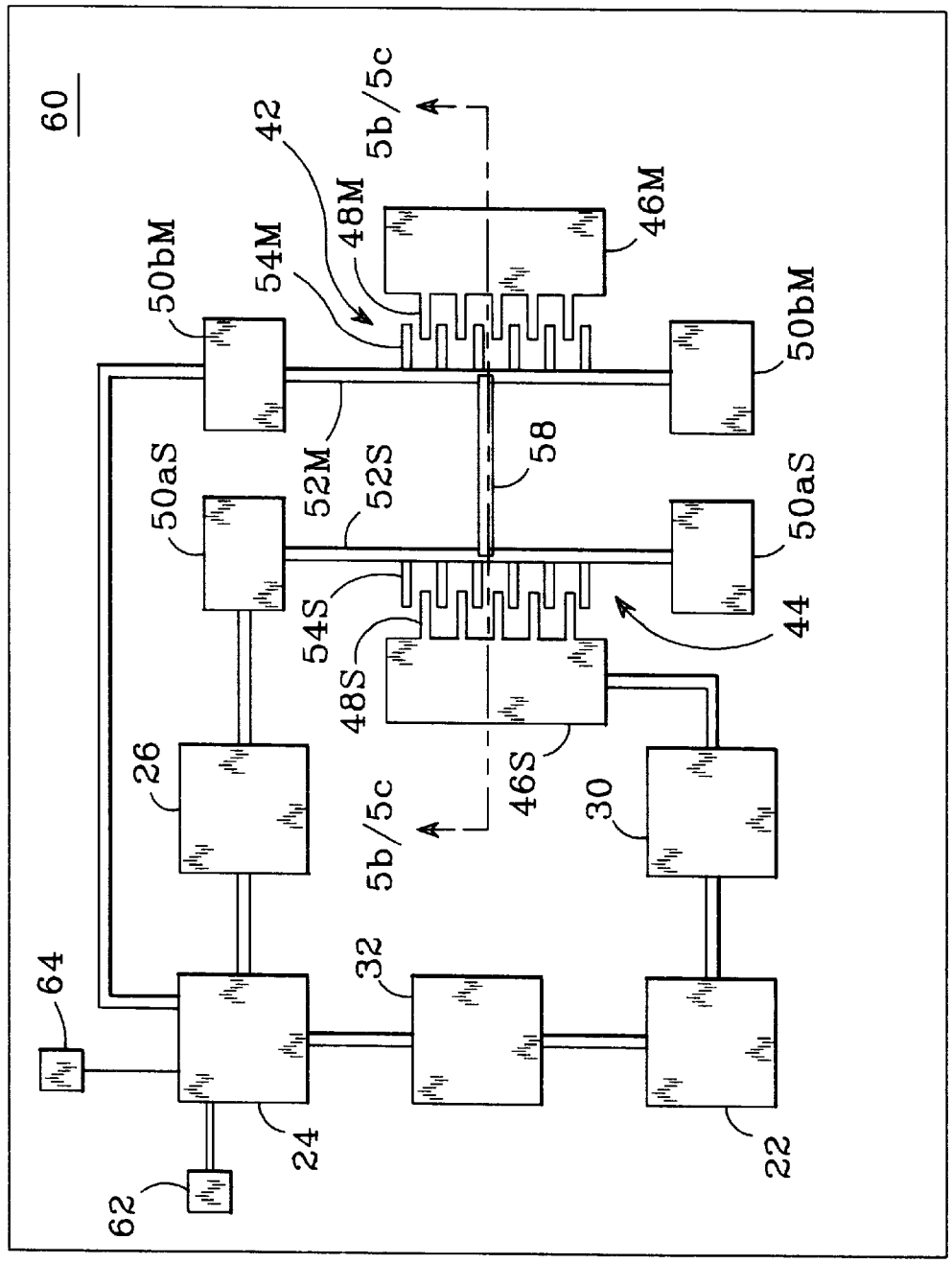
Figure 4B:
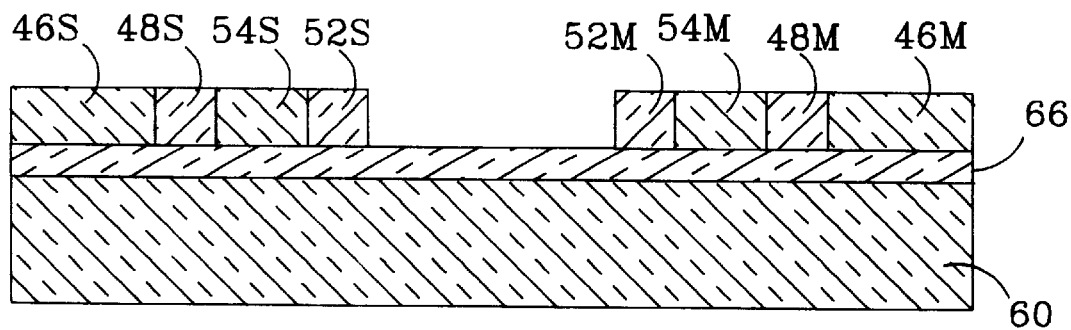
FIGS. 4b and 5b are sectional views taken along sectional lines 4b–4b and 5b–5b of FIGS. 4a and 4b, respectively.
Figure 5B:
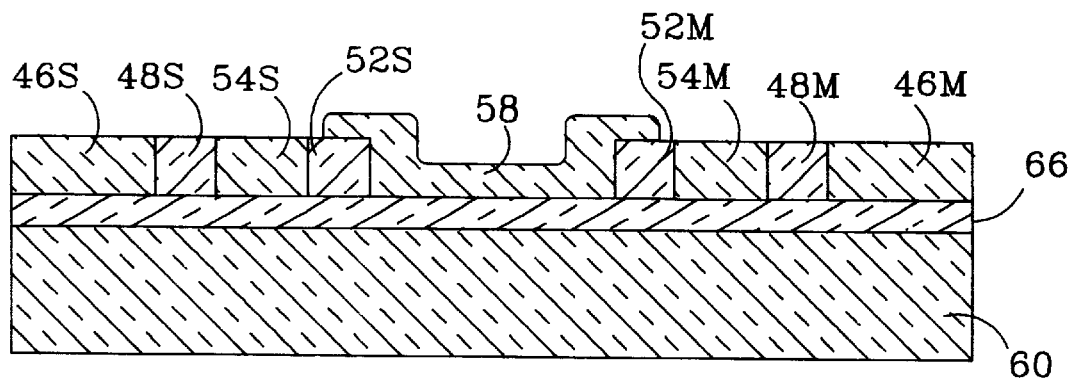
Figure 5C:
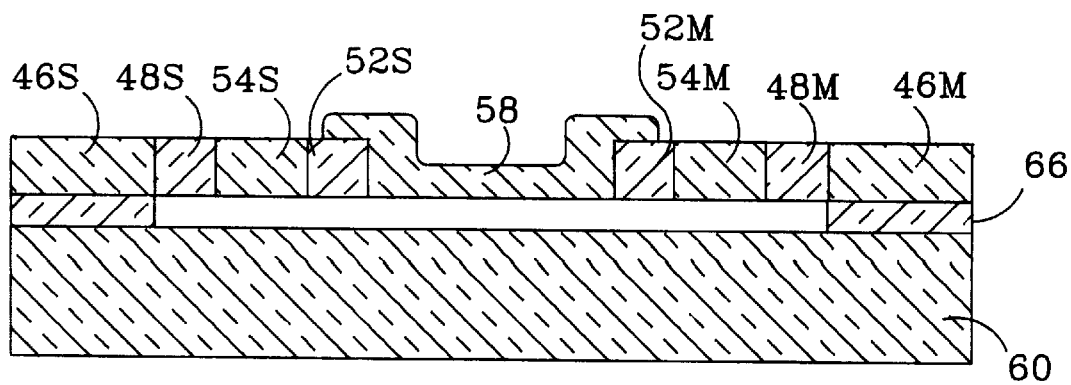
FIG. 5c is a sectional view taken along section line 5c–5c of FIG. 5a depicting the raised bridge structure of the tunable MEMS capacitor.

When fabricating a conventional MMIC, the active devices are fabricated using MMIC fabrication processes, followed by the fabrication of the passive components and the concurrent deposition and patterning of metal interconnecting runs ("runs") which connect the circuit elements together. The invention utilizes the processing steps that create the runs to concurrently fabricate the preferred MEMS tunable capacitor and to interconnect the capacitor with the other circuitry. Plan views of a fabrication sequence showing the integration of an active device in a MEMS tunable capacitor are shown in FIGS. 4a and 5a and corresponding sectional views are shown in FIGS. 4b, 5b taken across section lines 4b—4b and 5b—5b respectively. FIG. 5c is a sectional view taken across section 5c—5c of FIG. 5a showing the free-standing capacitor structure. The steps described and shown are intended only to illustrate the process sequence, they're not intended to depict the implementation of a particular function or frequency synthesizer. However, the process of simultaneously building up both the MEMs tunable capacitor and the interconnecting runs shown in FIGS. 4a, 4b, 5a, 5b and 5c may be extended as necessary to produce functional circuits.

FIGS. 4a and 5a fit one implementation of a MEMS tunable capacitor 38 shown in FIG. 2, integrated into a charge-pump phase-lock loop circuit 20 fabricated on a single crystal silicone substrate 60. Voltage control oscillator 22, phase detector 24, charge pump 26, low pass filter 30 and divider 32 are shown schematically fabricated on substrate 60, by known methods. Phase detector 24 furthermore has a series of pads 62 and 64 which the circuit receives and provides signals respectively. There are many possible ways of fabricating the MEMS tunable capacitor 38. One way is to use a silicon on insulator (SOI) wafer structure where the top silicon will be used as the capacitors structural material. A photo resist is first patterned forming contacts 46M, 46S, 50aM, 50aS, 50bM, 50bS and fingers 48M, 48S, 54M, 54S and bridges 52M and 52S. The pattern is then transferred to the top silicon 60 using reactive ion etching with an anisotropic sidewall profile that stops at a silicon dioxide layer 66 pattern on substrate 60. Next, a layer of $Si_3N_4$, suitably 0.5 to 2.0 microns thick to provide sufficient rigidity in the x-direction is patterned on the wafer to form mechanical coupler 58 that rigidly couples bridges 52M and 52S. Lastly, the wafer is subjected to a hydrofluoric acid (wet) etch to partially remove the underlying silicon dioxide layer 66, leaving the large structures still in tact with substrate 60 while the small geometry structures are free standing, as shown in FIG. 5c. Because all of the structure are formed in the top silicon, the control and signal capacitors are not, at this point, electrically isolated. Therefore, a deposition layer 68, suitably aluminum, covers the structure, specifically the capacitors fingers, to increase the conductivity of the master and slave capacitors with respect to the mechanical coupler 58 so that they are electrically isolated. The discontinuity between coupler 58 and bridges 52M and 52S create a discontinuity in the deposition layer that provides isolation. Additional details on the fabrication and use of the preferred MEMS tunable capacitor described above can be found in co-pending U.S. application Ser. No. 08/848,116 to Bartlett, et al. assigned to the same assignee as the present application and hereby incorporated by reference.

For the reasons noted above, it is preferred that circuit be fabricated together on a common substrate. However it is not essential that the invention be implemented this way. For example, MEMS capacitor 38 could be fabricated on a separate substrate and interconnected to the remainder of the circuit via wire bonds. This approach permits the MEMS device and the remainder of the circuit to be fabricated using different substrate materials and processing steps.

Though the integration of a MEMS tunable capacitor 38 and the series of active and passive devices of circuit was illustrated with a silicon substrate 60, other combinations of substrates are similarly contemplated.

In an alternate embodiment of the charge-pump phase-lock loop circuit, the MEMS tunable capacitor 38 can be replaced by a series of MEMS tunable capacitors which can be individually controlled by the circuit itself or by an external device. In a second alternate embodiment, the MEMS tunable capacitor 38 can be replaced by a MEMS switched capacitor bank. Additional details on the fabrication and use of the MEMS switched capacitor bank can be found in co-pending U.S. application Ser. No. 08/848,116 to Bartlett, et al. assigned to the same assignee as the present application and hereby incorporated by reference.

While several illustrative embodiments of the invention have been shown and described, numerous variations and alternate embodiments will occur to those skilled in the art. Such variations in alternate embodiments are contemplated, and can be made without departing from the spirit and scope of the invention as defined in the appended claims.

We claim:

1. An electric circuit for obtaining an information signal comprising:

a voltage control oscillator that produces a local signal;

a phase detector that compares a remote signal, comprising a carrier signal and an information signal, to said local signal;

a transresistance amplifier that converts the difference between said local and remote signals from a voltage into a current; and an a Micro Electro-Mechanical System (MEMS) capacitance device whose capacitance is adjustably tunable to integrate said current and provide a voltage to said voltage control oscillator to adjust said local signal.

2. The electric circuit of claim 1, wherein said circuit adjusts the capacitance of said MEMS capacitance device.

3. The electric circuit of claim 2, wherein said MEMS capacitance device is a MEMS tunable capacitor.

4. The electric circuit of claim 3, wherein said MEMS capacitance device has a tuning ratio of greater then 10 to 1.

5. The electric circuit of claim 3, wherein said MEMS tunable capacitor is adjustable by the use of electrostatic force.

6. The electric circuit of claim 3, wherein said MEMS capacitor comprises:

a flexure structure that is anchored to and suspended above a substrate so that it flexes along a direction of motion;

a control capacitor on said substrate, said control capacitor having a pair of opposing plates, at least one of said plates being connected to said flexure structure so that it is movable in response to an electrostatic force produced by a control voltage across said control capacitor, said force being proportional to the plates' overlapping surface area $A_C$;

a signal capacitor on said substrate that receives a signal voltage, said control capacitor having a pair of opposing plates, at least one of said plates being suspended so that it is movable; and a coupler that slaves the motion of said signal capacitor's movable plate to the motion of said control capacitor's movable plate to set the capacitance of said signal capacitor and electrically isolates the signal capacitor from the control capacitor, said flexure structure exhibiting a small spring constant in the direction of motion to allow a wide range of motion for tuning the signal capacitor, and said signal capacitor's surface area $A_S$ being smaller then the control capacitor's surface area $A_C$ and the spring constant of said isolator in the direction of an electrostatic force produced by said signal voltage being large to reduce the sensitivity of said signal capacitor's moveable plate to the signal voltage.

7. The tunable MEMS capacitor of claim 6, wherein said signal capacitor is an interdigitated capacitor whose plates have asymmetrically spaced interdigitated fingers where electrostatic force between fingers dominates the fringing force between the end of the fingers and opposing plate so that the direction of motion is orthogonal to the direction of the electrostatic force.

8. The tunable MEMS capacitor of claim 6, wherein said signal capacitor is a parallel-plate capacitor in which the control capacitor moves the signal capacitor's moveable plate so as to change the signal capacitor's surface area $A_S$ to set its capacitance while maintaining a substantially constant spacing between the signal capacitor's plates.

9. The electric circuit of claim 1, wherein said circuit is monolithically integrated on a common substrate.

10. The electric circuit of claim 9, wherein said common substrate is semi-insulating gallium arsenide (GaAs).

11. The electric circuit of claim 9, wherein said common substrate is silicon.

12. The electric circuit of claim 1, wherein said circuit further comprises:

a low pass filter to remove high frequency harmonics generated by the transresistance amplifier; and a divider to reduce the local frequency generated by the voltage control oscillator.

13. The electric circuit of claim 1, wherein said MEMS capacitance device comprises a plurality of series-connected MEMS switch-capacitor pairs to vary the total capacitance.

14. The electric circuit of claim 13, wherein said MEMS switch-capacitor pairs are mechanically switched by the use of electrostatic force to vary the total capacitance.

15. The electric circuit of claim 13, wherein said circuit is monolithically integrated on a common substrate.

16. The electric circuit of claim 15, wherein said common substrate is semi-insulating gallium arsenide (GaAs).

17. The electric circuit of claim 15, wherein said common substrate is silicon.

18. A method for obtaining an information signal, comprising:

setting an initial capacitance of a Micro Electro-Mechanical System (MEMS) capacitance device;

generating a local signal;

receiving a remote signal comprising a carrier signal and an information signal;

comparing the local signal to the carrier signal to determining the difference;

integrating the difference in the signals by the use of the MEMS capacitance device;

using the integrated signal to adjust the local signal;

adjusting the capacitance of the MEMS capacitance device;

repeating the above steps until the local signal is in sync with the carrier signal; and extracting the information signal.

19. The method of claim 18, further comprising the steps of:

generating a feedback signal based on the difference between the local signal and the carrier signal;

using said feedback signal to mechanically adjust the capacitance of said MEMS capacitance device.

20. The method of claim 19, further comprising the steps of:

filtering the integrated signal to remove unwanted high frequency harmonics; and dividing the local signal to reduce its frequency.

21. The method of claim 19, wherein said capacitance device is an adjustable (MEMS) capacitor.

22. The method of claim 21, wherein said MEMS capacitor has a adjusting ratio of greater then 10 to 1.

23. The method of claim 21, wherein said MEMS capacitor is adjustable by the use of electrostatic force.

24. The method of claim 19, wherein said method is conducted by a single circuit that is monolithically integrated on a common substrate.

25. The method of claim 24, wherein said common substrate is semi-insulating gallium arsenide (GaAs).

26. The method of claim 24, wherein said common substrate is silicon.

27. The method of claim 19, wherein said capacitance device is a plurality of series-connected MEMS switch-capacitor pairs.

28. The method of claim 27, wherein said MEMS switch-capacitor pairs are mechanically switched by the use of electrostatic force to vary the capacitance.

29. The method of claim 27, wherein said method is conducted by a single circuit that is monolithically integrated on a common substrate.

30. The method of claim 27, wherein said common substrate is semi-insulating gallium arsenide (GaAs).

31. The method of claim 27, wherein said common substrate is silicon.

32. A frequency synthesizer comprising:

a receiver for receiving a signal which comprises a carrier and an information signal;

a feedback circuit, containing said receiver and a Micro Electro-Mechanical System (MEMS) capacitance device, wherein said circuit generates a feedback adjustable local signal to synch with and remove said carrier signal to provide said information signal.

33. The frequency synthesizer of claim 32, wherein said circuit adjusts the capacitance of said MEMS capacitance device.

34. The electric circuit of claim 32, wherein said MEMS capacitance device is a MEMS tunable capacitor.

35. The electric circuit of claim 34, wherein said MEMS capacitor has a tuning ratio of greater then 10 to 1.

36. The electric circuit of claim 32, wherein said circuit is monolithically integrated on a common substrate.

37. The electric circuit of claim 32, wherein said circuit further comprises:

a low pass filter to remove high frequency harmonics; and a divider to reduce the local frequency generated by the voltage control oscillator.

38. The electric circuit of claim 32, wherein said MEMS capacitance device comprises a plurality of series-connected MEMS switch-capacitor pairs to vary the total capacitance.

* * * * *